US009698296B2

(12) United States Patent
Huang et al.

(10) Patent No.: US 9,698,296 B2
(45) Date of Patent: Jul. 4, 2017

(54) COMPENSATED PHOTONIC DEVICE STRUCTURE AND FABRICATION METHOD THEREOF

(71) Applicant: SiFotonics Technologies Co., Ltd., Woburn, MA (US)

(72) Inventors: Mengyuan Huang, Beijing (CN); Liangbo Wang, Beijing (CN); Su Li, Beijing (CN); Tuo Shi, Beijing (CN); Pengfei Cai, Beijing (CN); Wang Chen, Beijing (CN); Ching-yin Hong, Lexington, MA (US); Dong Pan, Andover, MA (US)

(73) Assignee: SIFOTONICS TECHNOLOGIES CO., LTD., Woburn, MA (US)

( * ) Notice: Subject to any disclaimer, the term of this patent is extended or adjusted under 35 U.S.C. 154(b) by 125 days.

(21) Appl. No.: 14/326,250

(22) Filed: Jul. 8, 2014

(65) Prior Publication Data
US 2015/0008433 A1    Jan. 8, 2015

Related U.S. Application Data

(60) Provisional application No. 61/957,627, filed on Jul. 8, 2013.

(51) Int. Cl.
| | | |
|---|---|---|
| H01L 31/109 | (2006.01) | |
| H01L 31/107 | (2006.01) | |
| H01L 31/105 | (2006.01) | |

(52) U.S. Cl.
CPC ........ *H01L 31/1075* (2013.01); *H01L 31/105* (2013.01)

(58) Field of Classification Search
CPC ............ H01L 31/109; H01L 31/03762; H01L 31/1075; H01L 31/105
USPC .................................................... 257/53, 184
See application file for complete search history.

(56) References Cited

U.S. PATENT DOCUMENTS

| | | | |
|---|---|---|---|
| 7,811,913 B2 | 10/2010 | Lee et al. | |
| 8,242,432 B2 * | 8/2012 | Feng ................. | G02B 6/12004 250/214 R |
| 2007/0141744 A1 * | 6/2007 | Lee ....................... | H01L 31/105 438/64 |

(Continued)

OTHER PUBLICATIONS

W.G. Oldham and A.G. Milnes, Interface States in Abrupt Semiconductor Heterojunctions, Solid-State Electronics, Pergamon Press 1964. vol. 7, pp. 153-165.

*Primary Examiner* — Hrayr A Sayadian
(74) *Attorney, Agent, or Firm* — Han IP Corporation; Andy M. Han

(57) ABSTRACT

Various embodiments of a compensated photonic device structure and fabrication method thereof are described herein. In one aspect, a photonic device may include a substrate and a functional layer disposed on the substrate. The substrate may be made of a first material and the functional layer may be made of a second material that is different from the first material. The photonic device may also include a compensation region formed at an interface region between the substrate and the functional layer. The compensation region may be doped with compensation dopants such that a first carrier concentration around the interface region of function layer is reduced and a second carrier concentration in a bulk region of functional layer is reduced.

8 Claims, 5 Drawing Sheets

(56) References Cited

U.S. PATENT DOCUMENTS

| | | | | |
|---|---|---|---|---|
| 2008/0012104 A1* | 1/2008 | Pauchard | ........ | H01L 31/035281 257/676 |
| 2013/0039664 A1* | 2/2013 | Clifton | ................ | H01L 31/0352 398/200 |
| 2014/0239301 A1* | 8/2014 | Huang | ................ | H01L 31/1075 257/53 |

* cited by examiner

COMPENSATED PHOTONIC DEVICE STRUCTURE AND FABRICATION METHOD THEREOF

CROSS-REFERENCE TO RELATED PATENT APPLICATIONS

This is a non-provisional application that claims the priority benefit of U.S. Patent Application No. 61/957,627, filed on Jul. 8, 2013, which is incorporated by reference in its entirety.

TECHNICAL FIELD

The present disclosure relates to photonic devices. More particularly, the present disclosure relates to a compensated photonic device structure and fabrication method thereof.

BACKGROUND

For photonic devices utilizing multiple materials/layers, such as germanium-on-silicon (Ge-on-Si) photodiode or gallium arsenide on silicon (GaAs-on-Si) photodiode, these upper layers' (Ge, GaAs, etc) lattice constants are largely different from that of the substrate layer (Si). As a result, various defects and dislocations (such as threading and misfit dislocations) can be observed inside these upper layers, which may include defect energy states in these upper layers, especially in the interface region between different materials/layers. Moreover, these defects in upper layers can behave as acceptor-like dopants and have an effective carrier concentration. For example, the carrier concentration (caused by defects) around the interface region of Ge-on-Si is typically in the range of $10^{15} \sim 10^{18}$ $cm^{-3}$. Because of the existence of defect-induced carrier concentration, the affected region is more difficult to be depleted (compared to intrinsic material) and it requires a higher bias voltage to be applied for photodiode or avalanche photodiode operation. For high speed devices capable of operating at a speed of 25 GHz or beyond, such higher applied bias is undesirable and unacceptable. Moreover, a high applied bias tends to cause high electric field, which may likely lead to high leakage current.

SUMMARY

This section highlights certain features of the inventive concept of the present disclosure, and in no way is to be interpreted as limiting the scope of the claimed subject matter as well as any deviations and derivatives thereof.

In one aspect, a compensated photonic device may include a substrate and a functional layer disposed on the substrate. The substrate may be made of a first material and the functional layer may be made of a second material that is different from the first material. The photonic device may also include a compensation region formed at an interface region between the substrate and the functional layer. The compensation region may be doped with compensation dopants such that a first carrier concentration (caused by defects) around the interface region of the function layer is reduced and a second carrier concentration (caused by defects) in a bulk region of the functional layer is reduced.

In some embodiments, an overall carrier concentration in the functional layer of the photonic device may be 50% or less of that of a non-compensated photonic device.

In some embodiments, the first material may be made of silicon (Si), and the second material may be made of germanium (Ge), germanium silicon (GeSi) or gallium arsenide (GaAs).

In some embodiments, a lattice mismatch greater than 1% may exist between the substrate and the functional layer.

In some embodiments, the interface region may include interface defect energy states. The second material may include germanium (Ge). The interface defect energy states may include p-type defect energy states in Ge layer.

In some embodiments, a carrier concentration (caused by defects) around the interface region may be in a range of $10^{15} \sim 10^{18}$ $cm^{-3}$ for Ge-on-Si.

In another aspect, a photonic device may include a silicon-based substrate, a first contact layer heavily doped with first-type dopants and disposed on the substrate, a multiplication layer disposed on the first contact layer, a charge layer doped with second-type dopants and disposed on the multiplication layer, a Ge absorption layer disposed on the charge layer, a second contact layer heavily doped with the second-type dopants and disposed on the Ge absorption layer, one or more anti-reflection layers disposed on the second contact layer, and a compensation region formed at an interface region between the charge layer and the Ge absorption layer.

In some embodiments, an overall carrier concentration in the Ge absorption layer of the photonic device may be 50% or less of that of a non-compensated photonic device.

In some embodiments, the first-type dopants may include n-type dopants and the second-type dopants may include p-type dopants.

In some embodiments, the multiplication layer may include intrinsic Si.

In some embodiments, the Ge absorption layer may include intrinsic Ge.

In some embodiments, the second contact layer may include an amorphous Si layer that is heavily doped with the second-type dopants.

In some embodiments, the one or more anti-reflection layers may include one or more oxide and silicon-nitride layers.

In some embodiments, the compensation region may be doped with n-type dopants and configured to compensate p-type defect energy states.

In some embodiments, the first-type dopants may include arsenic, phosphorous, or another n-type dopants.

In some embodiments, a dosage of the first-type dopants in the compensation region may be less than a dosage of the second-type dopants in the charge layer.

In yet another aspect, a photonic device may include a silicon-based substrate, a second contact layer heavily doped with second-type dopants and disposed on the substrate, a Ge absorption layer disposed on the second contact layer, a first contact layer heavily doped with first-type dopants and disposed on the Ge absorption layer, one or more anti-reflection layers disposed on the first contact layer, and a compensation region formed at an interface region between the second contact layer and the Ge absorption layer.

In some embodiments, the first-type dopants may include n-type dopants and the second-type dopants may include p-type dopants.

In some embodiments, the second contact layer may include Si heavily doped with the second-type dopants.

In some embodiments, the Ge absorption layer may include intrinsic Ge.

In some embodiments, the first contact layer may include an amorphous Si layer that is heavily doped with the first-type dopants.

In some embodiments, the one or more anti-reflection layers may include one or more oxide and silicon-nitride layers.

In some embodiments, an overall carrier concentration in the Ge absorption layer of the photonic device may be 50% or less of that of a non-compensated photonic device.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Example Implementations

To solve the aforementioned problems, the present disclosure provides a compensated photonic device structure and fabrication method thereof.

Figure 1:
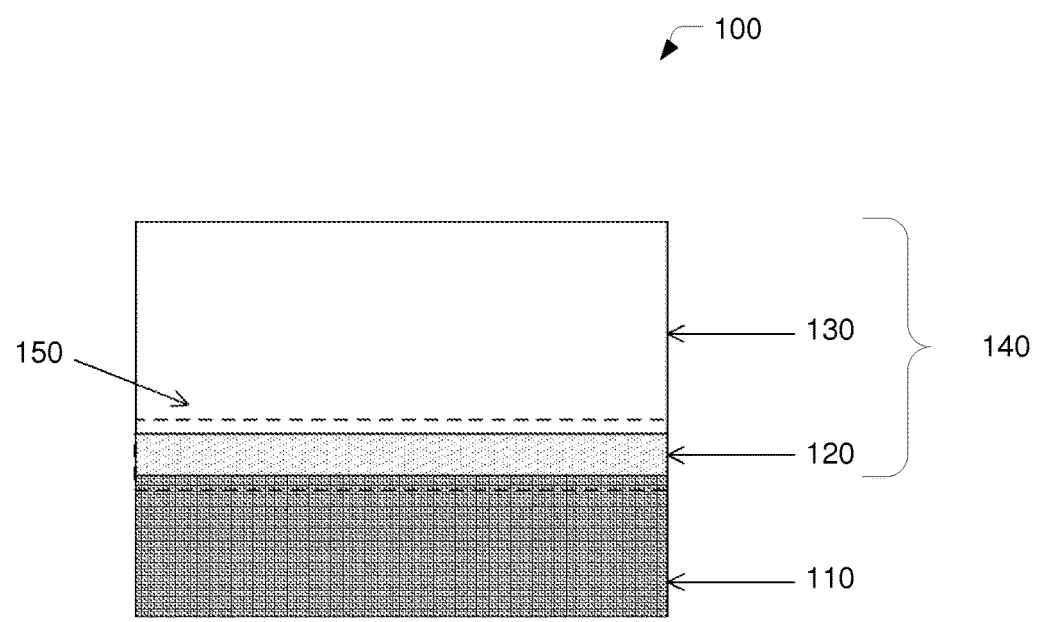
FIG. 1 is a cross-sectional view of a compensated photonic device in accordance with an embodiment of the present disclosure.

FIG. 1 is a cross-sectional view of a compensated photonic device 100 in accordance with an embodiment of the present disclosure. Different from conventional structures, the structure of compensated photonic device 100 may include at least a substrate 110 and a functional layer 140 disposed on the substrate 110. Substrate 110 may be made of Si or other suitable materials. Functional layer 140 may be an absorption layer for photodiode, and may be made of a material different from that of the substrate, e.g., Ge, GeSi, GaAs, etc. In some embodiments, there may be a large lattice mismatch (>1%) between the materials of the substrate 110 and the functional layer 140, e.g., 4.2% for Ge-on-Si. In some embodiments, the functional layer 140 may include a bulk region 130 and an interface region 120, with the interface region 120 interfacing the substrate 110 and disposed between the bulk region 130 and the substrate 110. In some embodiments, there may be some interface defect energy states in an interface region 120 of the functional layer 140, e.g., p-type defect energy states for Ge-on-Si, and the carrier concentration (caused by defect) in interface region 120 is in the range of $10^{15}$~$10^{18}$ cm$^{-3}$ for Ge-on-Si. In some embodiments, compensated photonic device 100 may also include a compensation region 150 (alternatively referred to as compensated doping region herein) that encompasses the interface region 120 as well as a portion of the substrate 110 and a portion of the bulk region adjacent the interface region 120. The compensation region 150 has some compensation dopants (e.g., n-type dopants) added therein to reduce the carrier concentration around the interface region 120. The compensation dopants may also help reduce the carrier concentration in bulk region 130 of the functional layer 140. Advantageously, an overall carrier concentration in the functional layer of compensated photonic device 100 is 50% or less of that of a non-compensated photonic device.

Figure 2:
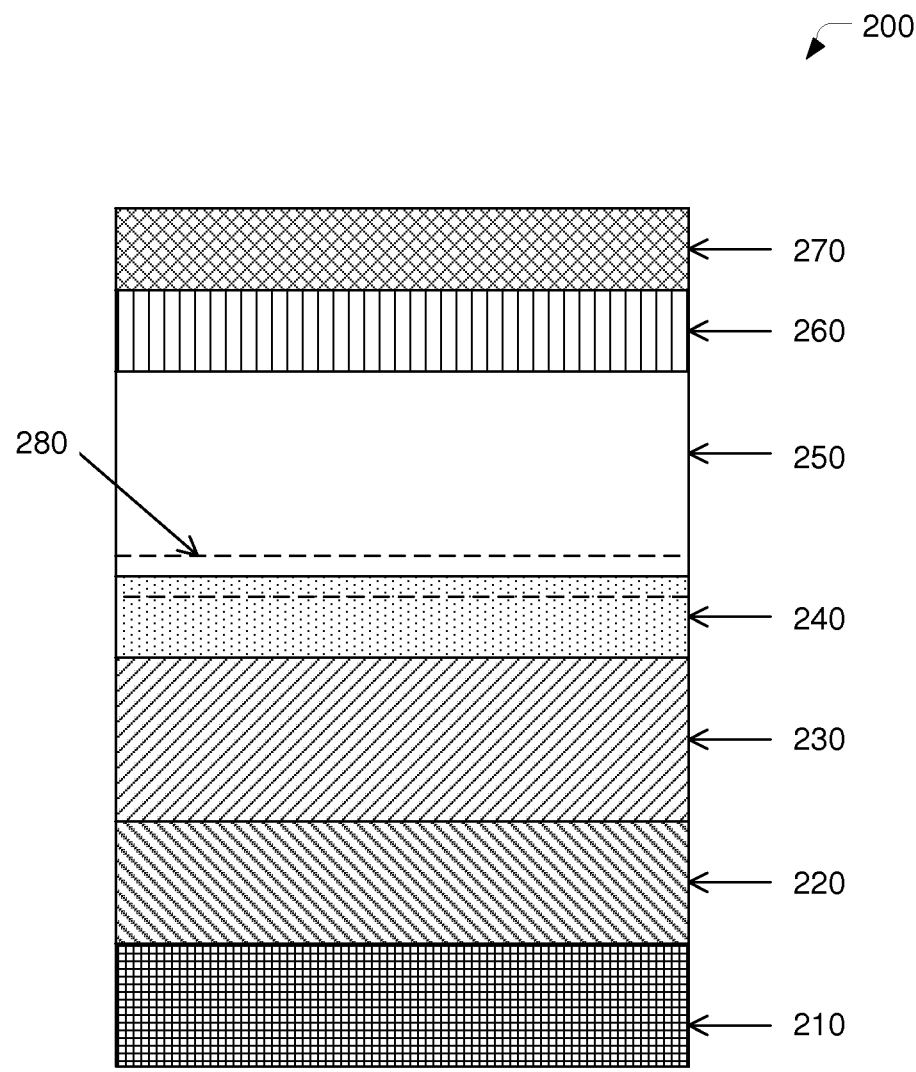
FIG. 2 is a cross-sectional view of a compensated photonic device in accordance with another embodiment of the present disclosure.

FIG. 2 is a cross-sectional view of a compensated photonic device 200 in accordance with another embodiment of the present disclosure. Compensated photonic device 200 may be an avalanche photodiode. As shown in FIG. 2, compensated photonic device 200 may include a substrate 210, a first contact layer 220 heavily doped with first-type dopants and disposed on the substrate 210, a multiplication layer 230 disposed on the first contact layer 220, a charge layer 240 doped with second-type dopants and disposed on the multiplication layer 230, a Ge absorption layer 250 disposed on the charge layer 240, a second contact layer 260 heavily doped with second-type dopants and disposed on the Ge absorption layer 250, and one or more anti-reflection layers 270 disposed on the second contact layer 260. Compensated photonic device 200 may also include a compensation region 280 formed at the interface region between the charge layer 240 and the Ge absorption layer 250.

In some embodiments, the substrate 210 may be a bulk Si or silicon-on-insulator (SOI) wafer. In some embodiments, the first contact layer 220 may include Si heavily doped with the first-type dopants (e.g., n+ contact layer). In some embodiments, the multiplication layer 230 may include intrinsic Si. In some embodiments, the charge layer 240 may include Si doped with the second-type dopants (e.g., p-type charge layer). In some embodiments, the Ge absorption layer 250 may include intrinsic Ge. In some embodiments, the second contact layer 260 may include an amorphous Si layer that is heavily doped with the second-type dopants (e.g., p+ contact layer). In some embodiments, the one or more anti-reflection layers 270 may include one or more oxide and silicon-nitride layers.

In the present disclosure, the first-type dopants may be n-type dopants and the second-type dopants may be p-type dopants. Alternatively, the first-type dopants may be p-type dopants and the second-type dopants may be n-type dopants.

In some embodiments, the compensation region 280 may be doped with the first-type dopants (e.g., n-type dopants), and may be configured to compensate the second-type (e.g., p-type) defect energy states or the like.

In some embodiments, the first-type dopants (e.g., n-type dopants) may be arsenic, phosphorous, or other suitable n-type dopants.

In some embodiments, the total dosage of the first-type dopants (e.g., n-type dopants) in the compensation region 280 may be less than the dosage of the second-type dopants (e.g., p-type dopants) in the charge layer 240.

Figure 3:
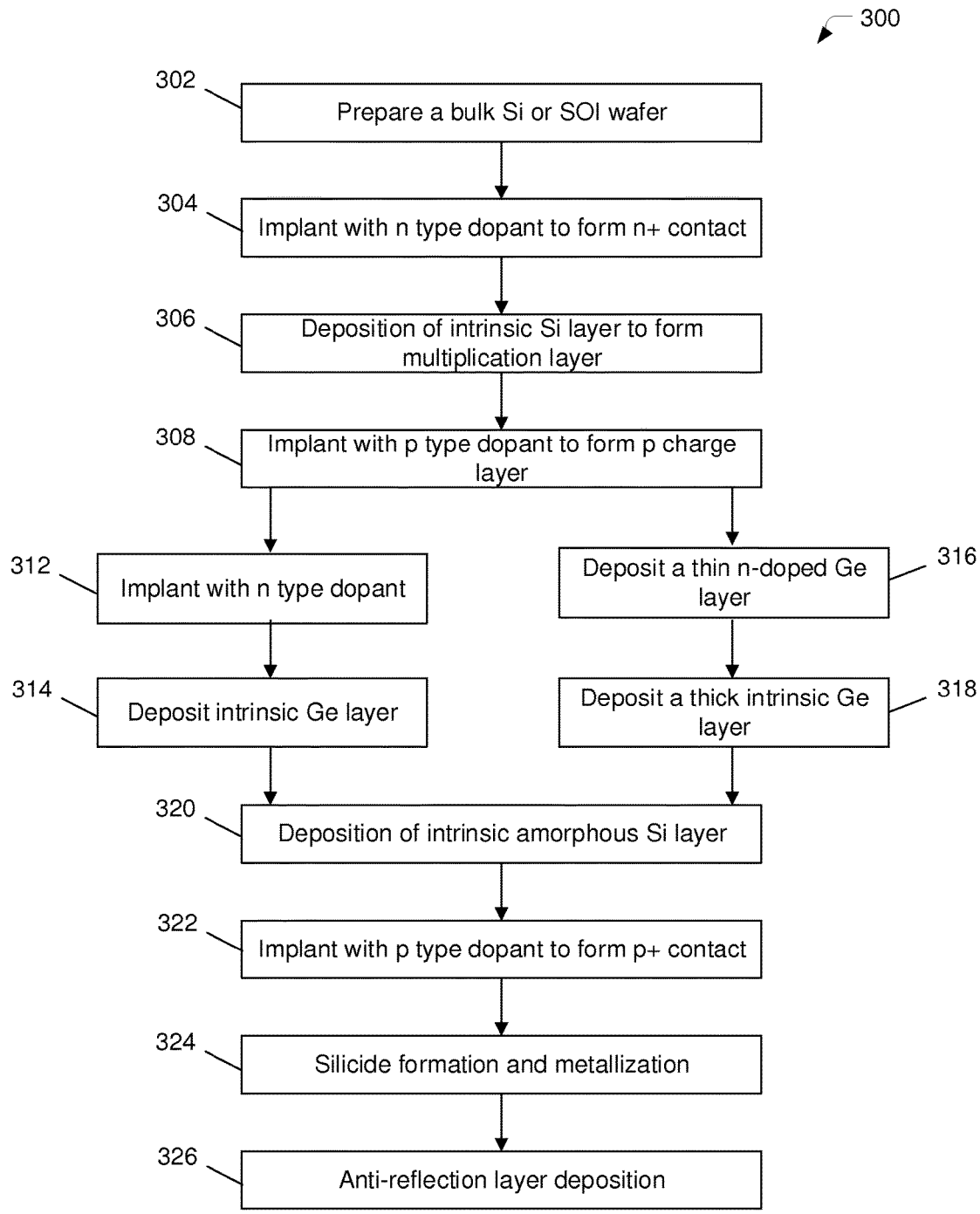
FIG. 3 is a flow chart of a fabrication method of a compensated photonic device with a compensation region in accordance with another embodiment of the present disclosure.

FIG. 3 is a flow chart of a fabrication method 300 of a compensated photonic device with a compensation region in accordance with another embodiment of the present disclosure. In summary, an example implementation of the fabrication method 300 may include at least the following operations: (a) after formation of the p-type charge layer, adding one or more n-type implant on the Si p-type charge layer and then depositing an intrinsic Ge layer, into which n-type dopants may diffuse from the Si p-type charge layer; (b) during Ge growth, depositing a thin in-situ Ge layer doped with n-type dopants; and after formation of the Ge layer doped with n-type dopants, depositing a thick intrinsic Ge layer thereon.

At 302, a bulk Si or SOI wafer is prepared as the substrate.

At 304, the substrate is implanted with n-type dopants to form an n+ contact layer.

At 306, an intrinsic Si layer is deposited on the n+ contact layer to form a multiplication layer.

At 308, the multiplication layer is implanted with p-type dopants to form a p-type charge layer.

At 312, the p-type charge layer is implanted with n-type dopants.

At 314, an intrinsic Ge layer is deposited on the p-type charge layer to form a Ge absorption layer.

Alternatively, operations 312 and 314 may be substituted by operations 316 and 318.

At 316, a thin n-doped Ge layer is deposited on the p-type charge layer to form a compensation region/layer.

At 318, a thick intrinsic Ge layer is deposited on the compensation region/layer to form the Ge absorption layer.

Subsequent to the formation of the formation of the Ge absorption layer, the fabrication method 300 continues with operation 320.

At 320, an intrinsic amorphous Si layer is deposited on the Ge absorption layer.

At 322, the intrinsic amorphous Si layer is implanted with p-type dopants to form a p+ contact layer.

At 324, silicide formation and metallization is performed.

At 326, one or more anti-reflection layers are deposited on the p+ contact layer.

Figure 4:
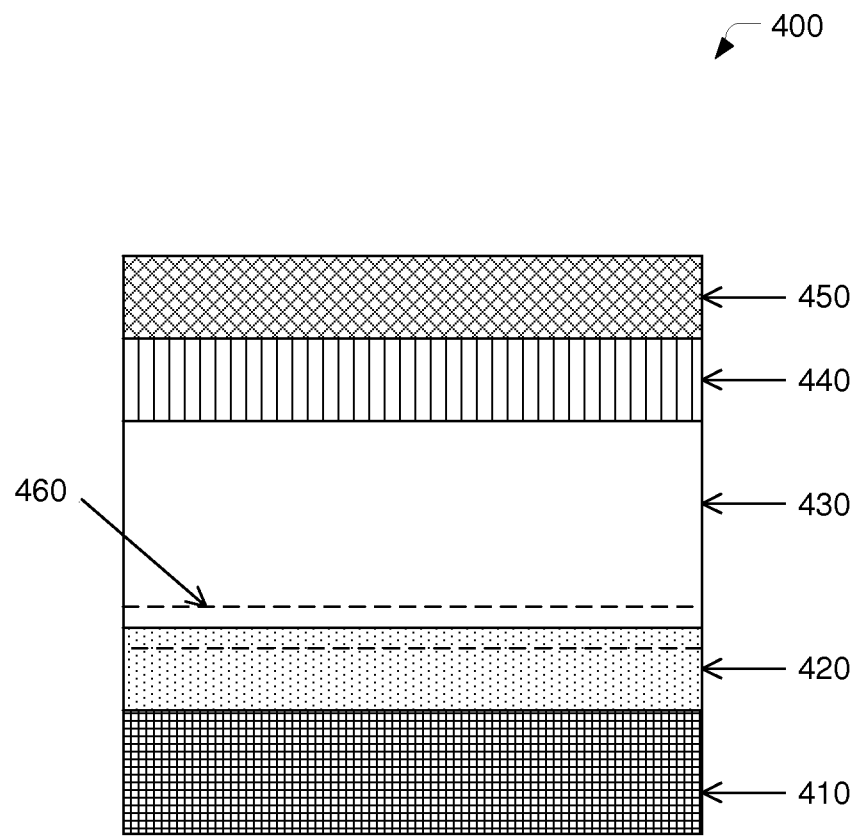
FIG. 4 is a cross-sectional view of a compensated photonic device in accordance with yet another embodiment of the present disclosure.

FIG. 4 is a cross-sectional view of a compensated photonic device 400 in accordance with yet another embodiment of the present disclosure. Compensated photonic device 400 may be a compensated PIN photodiode. As shown in FIG. 4, compensated photonic device 400 may include at least a substrate 410, a second contact layer 420 heavily doped with the second-type dopants and disposed on the substrate 410, a Ge absorption layer 430 disposed on the second contact layer 420, a first contact layer 440 heavily doped with the first-type dopants and disposed on the Ge absorption layer 430, and one or more anti-reflection layers 450 disposed on the first contact layer 440. Compensated photonic device 400 may also include a compensation region 460 formed at the interface region between the second contact layer 420 and the Ge absorption layer 430.

In some embodiments, the substrate 410 may be a bulk Si or SOI wafer. In some embodiments, the second contact layer 420 may include Si heavily doped with the second-type dopants (e.g., p+ contact layer). In some embodiments, the Ge absorption layer 430 may include intrinsic Ge. In some embodiments, the first contact layer 440 may include an amorphous Si layer that is heavily doped with the first-type dopants (e.g., n+ contact layer). In some embodiments, the one or more anti-reflection layers 450 may include one or more oxide and silicon-nitride layers.

In some embodiments, the compensation region 460 may be doped with the first-type dopants (e.g., n-type dopants), and may be configured to compensate the second-type (e.g., p-type) defect energy states or the like.

In some embodiments, the first-type dopants (e.g., n-type dopants) may be arsenic, phosphorous, or other suitable n-type dopants.

In some embodiments, the total dosage of the first-type dopants (e.g., n-type dopants) in the compensation region 460 may be much less than the dosage of the second-type dopants (e.g., p-type dopants) in the second contact layer 420.

Figure 5:
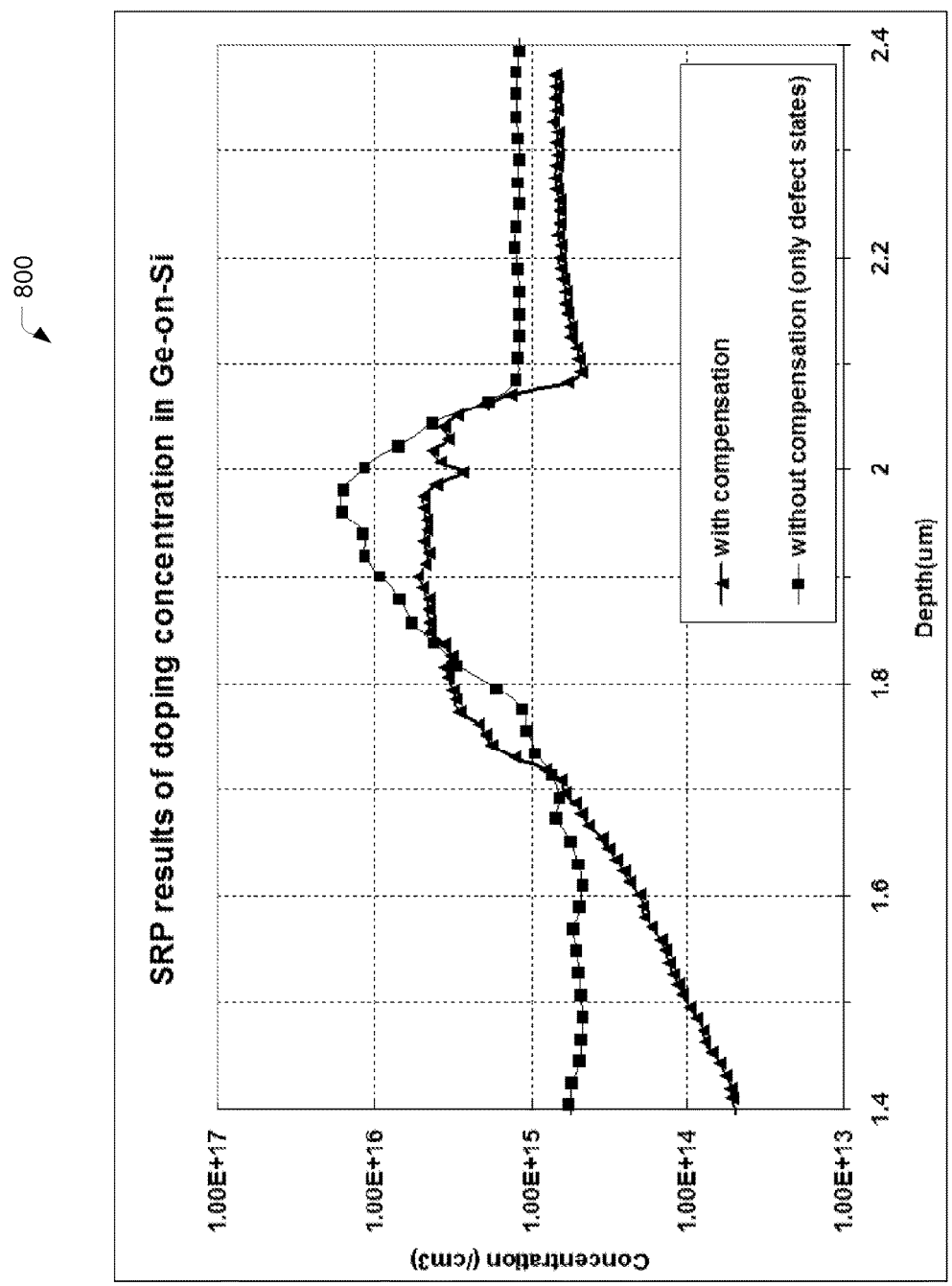
FIG. 5 is a chart showing spreading resistance profiling (SRP) results of different Ge-on-Si samples for a compensated photonic device in accordance with an embodiment of the present disclosure.

FIG. 5 is a chart 500 showing spreading resistance profiling (SRP) results of different Ge-on-Si samples for a compensated photonic device in accordance with an embodiment of the present disclosure. As depicted in the chart 500, samples with compensation, the doping concentration at Ge/Si interface is lower than that of samples without compensation. The following can be seen in the SRP results: (a) the compensated Ge layer has lower concentration in the interface region (e.g., in the region between 1.6 µm and 2.1 µm in chart 500): the carrier concentration of non-compensated Ge/Si device can reach 1e16 cm$^{-3}$, but that of compensated Ge/Si device is only 5e15 cm$^{-3}$; and (b) the compensated Ge layer also has lower concentration in the Ge bulk region (e.g., in the region between 1.4 µm and 1.6 µm in chart 500): the carrier concentration of non-compensated Ge/Si device is around 6e14 cm$^{-3}$, but that of compensated Ge/Si device can be less than 1e14 cm$^{-3}$.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A photonic device, comprising:
    a silicon-based substrate;
    a first contact layer heavily doped with first-type dopants and disposed on the substrate;
    a multiplication layer disposed on the first contact layer;
    a charge layer doped with second-type dopants and disposed on the multiplication layer;
    a germanium (Ge) absorption layer disposed on the charge layer;
    a second contact layer heavily doped with the second-type dopants and disposed on the Ge absorption layer; and
    one or more anti-reflection layers disposed on the second contact layer,
    wherein a portion of the charge layer interfacing the Ge absorption layer and a portion of the Ge absorption layer interfacing the charge layer together form a compensation region, the compensation region doped with compensation dopants such that an effective carrier concentration caused by defect energy states is reduced and a second carrier concentration in a bulk region of the Ge absorption layer is reduced,
    wherein the charge layer is implanted with first-type dopants such that the compensation region is doped with the first-type dopants,
    wherein the first-type dopants comprise n-type dopants,
    wherein the second-type dopants comprise p-type dopants, and
    wherein the n-type dopants in the compensation region compensate p-type defect energy states.

2. The photonic device of claim 1, wherein an overall carrier concentration in the Ge absorption layer of the photonic device is reduced by at least 50% as a result of the compensation region.

3. The photonic device of claim 1, wherein the multiplication layer comprises silicon (Si).

4. The photonic device of claim 1, wherein the Ge absorption layer comprises Ge.

5. The photonic device of claim 1, wherein the second contact layer comprises an amorphous Si layer that is heavily doped with the second-type dopants.

6. The photonic device of claim 1, wherein the one or more anti-reflection layers comprise one or more oxide and silicon-nitride layers.

7. The photonic device of claim 1, wherein the first-type dopants comprise arsenic, phosphorous, or another n-type dopants.

8. The photonic device of claim 1, wherein a dosage of the first-type dopants in the compensation region is less than a dosage of the second-type dopants in the charge layer.

* * * * *